United States Patent
Fang et al.

(10) Patent No.: US 6,477,678 B1
(45) Date of Patent: Nov. 5, 2002

(54) METHOD AND DEVICE FOR ERROR CORRECTING CODING FOR HIGH RATE DIGITAL DATA TRANSMISSIONS, AND CORRESPONDING DECODING METHOD AND DEVICE

(75) Inventors: Juing Fang, Levallois (FR); Vincent Lemaire, Palaiseau (FR)

(73) Assignee: Alcatel, Paris (FR)

( * ) Notice: Subject to any disclaimer, the term of this patent is extended or adjusted under 35 U.S.C. 154(b) by 0 days.

(21) Appl. No.: 09/446,517

(22) PCT Filed: Apr. 26, 1999

(86) PCT No.: PCT/FR99/00980

§ 371 (c)(1),
(2), (4) Date: Dec. 28, 1999

(87) PCT Pub. No.: WO99/56398

PCT Pub. Date: Nov. 4, 1999

(30) Foreign Application Priority Data

Apr. 28, 1998 (FR) .............................................. 98 05332

(51) Int. Cl.⁷ ........................ H03M 13/23; H03M 13/29
(52) U.S. Cl. ........................ 714/755; 714/776; 714/793
(58) Field of Search ................................ 714/786, 793, 714/755, 776

(56) References Cited

U.S. PATENT DOCUMENTS

| | | | | | |
|---|---|---|---|---|---|
| 3,227,999 A | * | 1/1966 | Hagelbarger | ................ | 714/760 |
| 3,728,678 A | * | 4/1973 | Tong | .......................... | 714/787 |
| 4,404,674 A | * | 9/1983 | Rhodes | ........................ | 714/793 |
| 5,193,094 A | * | 3/1993 | Viterbi | ........................ | 714/795 |
| 5,729,560 A | * | 3/1998 | Hagenauer et al. | .......... | 714/786 |
| 5,734,962 A | * | 3/1998 | Hladik et al. | ................ | 370/342 |
| 5,841,776 A | * | 11/1998 | Chen | ........................... | 370/441 |
| 5,907,582 A | * | 5/1999 | Yi | ................................ | 370/208 |
| 6,000,054 A | * | 12/1999 | Bahr et al. | ................... | 714/786 |
| 6,023,783 A | * | 2/2000 | Divsalar et al. | ............. | 375/262 |
| 6,038,695 A | * | 3/2000 | Pehkonen | ................... | 714/786 |
| 6,088,387 A | * | 7/2000 | Gelblum et al. | ............ | 375/222 |
| 6,167,552 A | * | 12/2000 | Gagnon et al. | ............. | 714/760 |
| 6,189,123 B1 | * | 2/2001 | Anders et al. | .............. | 714/751 |

OTHER PUBLICATIONS

Mackenthun, "Block Orthogonal Convolutional Coding for the INTELSAT TDMA Data Channel", COMSAT Technical Review, vol. 14, No. 2, Fall 1984, pp. 261–283.*

Atkin et al., "Orthogonal Convolutional Coding for the PPM Optical Channel", Journal of Lightwave Technology, vol. 7, No. 4, Apr. 1989, pp. 731–734.*

Svirid et al., "Threshold Decoding of Turbo–Codes", ISIT '95, p. 39.*

Benedetto et al., "Unveiling Turbo Codes: Some Results on Parallel Concatenated Coding Schemes", IEEE Transactions on Information Theory, vol. 42, No. 2, Mar. 1996, pp. 409–428.*

Robertson et al., "A Novel Bandwidth Efficient Coding Scheme Employing Turbo Codes", ICC '96, pp. 962–967.*

(List continued on next page.)

Primary Examiner—Stephen M. Baker
(74) Attorney, Agent, or Firm—Sughrue Mion, PLLC

(57) ABSTRACT

It is proposed to use channel coding involving a plurality of concatenated coders and decoders in series and in parallel for coded transmission in which the efficiency can be adapted as a function of the requirements of a system and an application. The coders of the invention are convolutional self-orthogonal code (CSOC) coders. It is shown that this enables perfect adaptation with circuits whose complexity and cost are low and which therefore support high bit rates.

19 Claims, 4 Drawing Sheets

OTHER PUBLICATIONS

Martin: "Optimal convolutional self–orthogonal codes with an application to digital radio" IEEE International Conference on Communications '85, Jun. 23–26, 1985, pp. 1249–1253, XP002086300, Chicago, IL, USA.

D. Haccoun et al.: "New Architectures for fast convolutional encoders and threshold decoders" IEEE Journal on Selected Areas in Communication vol. 6, No. 3, Apr. 1988, pp. 547–557, XP002086302, NY USA.

Fazel, K.: "Interative Decoding of Generalized Concatenated Blokh–Zyablov–Codes" 1996 IEEE International Conference on Communications (ICC), Converging Technologies for Tomorrow's Applications, Dallas, Jun. 23–27, 1996, vol. 1, Jun. 23, 1996, pp. 96–101, XP000625649, Institute of Electrical & Electronics Engineers.

Benedetto, S. et al.: "Performance Evaluation of Parallel Concatenated Codes" Communications—Gateway to Globalization Proceeding of the Conference on Communications, Seattle, Jun. 18–22, 1995, vol. 2, Jun. 18, 1995, pp. 663–667, XP000533097, Institute of Electrical and Electronics Engineers.

Battail G.: "A Conceptual Framework for Understanding Turbo Codes" IEEE Journal on Selected Areas in C Communications, vol. 16, No. 2, Feb. 1998, pp. 245–254, XP000741778.

* cited by examiner

METHOD AND DEVICE FOR ERROR CORRECTING CODING FOR HIGH RATE DIGITAL DATA TRANSMISSIONS, AND CORRESPONDING DECODING METHOD AND DEVICE

BACKGROUND OF THE INVENTION

The present invention relates to an error correcting coding method and apparatus for high bit rate digital data transmission, in particular long-haul fiber optic transmission, and to a corresponding decoding method and apparatus. The invention improves resistance to noise in transmitted digital messages by a system for coding the digital messages. It relates more particularly to the field of Forward Error Correction (FEC) coding, in which there is no feedback of information from the receiver, as opposed to Automatic Repeat reQuest (ARQ) coding, in which the receiver sends an acknowledgment. It is more particularly suitable for submarine fiber optic transmission systems.

In a very long-haul transmission system of this kind using a very high bit rate, in the order of several gigabits per second, FEC coding is essential to assuring quality of service and economizing on the number of optical amplifiers used as repeaters in the underwater part of the system. Error correcting coding reduces the overall cost of the system. It is also possible to regenerate the bits transmitted at reorganization nodes of a system of this kind. However, the complexity and the limited reliability of the equipment required to perform such regeneration rules out installing it in underwater repeaters.

Such links include the TAT12–TAT13 or Gemini transatlantic links, the SeaMeWe3 link running along the coasts of Europe and Asia and the Southern Cross or US/China transpacific links (some of these links are not yet operational).

More generally, in all transmission systems which use a very high bit rate, FEC coding has specific constraints in terms of the band expansion factor and above all in terms of processing speed and complexity. To enable implementation at low cost and with low power consumption it is therefore necessary to choose a coding process which offers high performance in terms of coding gain combined with low complexity.

The invention also envisages the use of concatenated coding. Concatenated coding generally uses an interior. code and an exterior code. Interior coding is the processing stage of the overall coding system which directly precedes transmission over the physical transmission medium, i.e. the optical fiber in this example. Exterior coding is the process coding the information bits to be transmitted before they are supplied to the. interior coding circuit. Concatenated coding achieves a good performance/complexity trade-off.

SUMMARY OF THE INVENTION

The object of the present invention is to propose several constructions and a low complexity implementation of interior coding, in particular in the context of a concatenated coding system. The concatenated coding then preferably uses a Reed-Solomon (RS) exterior code. The interior codes constructed in this way may nevertheless be usable on their own, depending on the intended application. Similarly, the exterior coding could use a code other than an RS code. For example, it could use a Convolutional Self-Orthogonal Code (CSOC). The object is to offer good performance and low complexity, highly suitable for transmission at very high bit rates, i.e. several gigabits per second, in particular in underwater fiber optic systems.

The prior art coding solutions include:
a) Non-binary Reed-Solomon block codes;
b) Binary Hamming or BCH block codes;
c) Concatenated codes using a) and/or b) for exterior and interior coding;
d) Concatenated coding of an PS code and a convolutional code with soft decision Viterbi decoding; and
e) "Turbo" coding.

The above coding solutions are insufficient, for the following reasons.

Solution a) uses very high performance coding and benefits from existing implementations of VLSI circuit components available from many silicon founders, thanks to the popularity of RS codes. For example there is the standard RS (255,239) code capable of correcting eight errors with only 16 (255–239) redundant bytes. However, RS codes using non-binary symbols are not suitable for binary transmission, e.g. fiber optic transmission. For example, for a fixed block length and fixed efficiency, a BCH code corrects a larger number of binary errors than an RS code.

With solution b) there is, in theory, no problem of adaptation to binary transmission. However, a Hamming code does not offer sufficient performance, although BCH codes necessitate the same complexity as RS codes. However, the drawback of BCH codes is that the circuits which execute them are not available for very high bit rates. Developing a BCH algebraic coding and decoding circuit is a much greater task than developing its RS counterpart. This is because there are no circuits for the BCH code in the libraries of VLSI circuit founders, although circuits are readily available for the RS code. There is therefore a considerable body of design work to be undertaken and the development time will be very long.

Solution c) means concatenated systems using an RS exterior code and another RS interior code or a BCH interior code. One of the two weaknesses of solutions a) and b) remains in this scheme. Moreover, this scheme can operate only with efficient interleaving, which can be very costly for high bit rates. This is because interior coding corrects most random errors but uncorrected residual errors tend to be grouped together. To correct them, the grouped residual errors must be distributed over several code words. This is achieved by interleaving on coding and corresponding de-interleaving on decoding.

Solution d) must use soft decisions if sufficient performance is to be achieved, i.e. with sampling and quantizing of the received signal over a dynamic range of several bits. There are still problems with implementing soft decision circuits for bit rates in the order of one gigabit per second. Viterbi decoding with a single decoder is not yet feasible. Several hundred decoders would be required for a decoder using Viterbi decoders in parallel, which is too great a number. Accordingly, the only circuit currently available is the ST-2060 from Standford Telecom, USA, which supports a bit rate of 45 Mbit/s. In the field of optical links, the bit rates envisaged are in the order of 10 Gbit/s per channel and it is planned to distribute 32 channels across the frequency bands used for optical transmission. Thus too great a number of Viterbi decoders (around 600) would be required. Also, interchanges between the various decoders would themselves be excessively voluminous and complex.

Solution e) requires soft decision decoding, quite apart from its inherent problem of complex iterative decoding. "Turbo" coding cannot be used for fiber optic transmission at several Gbits per second, for the same reasons as for solution d).

The object of the invention is to remedy the above drawbacks and to propose a solution capable of immediate and industrial implementation. The basic idea of the invention is to use convolutional self-orthogonal codes (CSOC) for the coding. The invention in fact uses composite convolutional self-orthogoral codes. CSOC are a class of codes with a high efficiency and very low complexity, but with low and medium coding gains. It is shown that they can nevertheless be beneficial in fiber optic transmission applications. They might also be beneficial in other applications.

The efficiency (K/N) is the ratio of the number (K) of information bits to be transmitted over the corresponding number (N) of symbols actually transmitted. The gain of a CSOC depends essentially on two parameters, namely the number of orthogonal equations (J) and the effective constraint length (Ne). Its gain expresses the reduction in the signal to noise ratio for which a given performance continues to be guaranteed. The greater the number of symbols to be sent, the greater the occupancy of the frequency bandwidth allocated to the channel, and the greater the redundancy.

The invention seeks not only low complexity but also to maximize gain. It will be shown that choosing CSOC circuits can nevertheless provide an extremely close match to the available bandwidth of the frequency channel used.

From this point of view, one object of the invention is to optimize occupancy of the available bandwidth by choosing codes as and when required, but without the corresponding coding circuits to be implemented becoming too complex to design and make.

CSOCs have been widely used in satellite transmission systems because they are simple to implement. Although their gain is low or medium, they were of sufficient benefit for such applications in the period from the 1960s to the 1980s, prior to the availability of the soft decision Viterbi algorithm. They are in fact very suitable if the level of the electronic technology is limited, whereas by comparison the soft decision Viterbi algorithm provides much improved performance but only if the technology level is not a limitation.

The inventors have realized that high bit rate transmission of optical signals on optical fibers is a comparable situation in that the bit rates are so high that it is not feasible to use the soft decision Viterbi algorithm. It has therefore appeared beneficial to use CSOC for these systems.

A single CSOC has too low a coding gain. The invention combines these codes to improve performance, as they are so simple to install, even when using only a moderate level of ASIC technology.

A specific property of CSOCs is that their decoders do not produce error packets at the output if there are uncorrected errors at the input. This property is used in an improvement constituting one feature of the present invention.

The basic idea of the invention is to combine a plurality of CGOC decoding circuits in new "composite CSOC" error correcting coding schemes to obtain performance comparable with schemes of class c) above, with low complexity. The present invention proposes a number of methods of constructing composite convolutional self-orthogonal codes and schemes for implementing them. It will be shown that these methods facilitate design, on demand, from typical circuits that are easy to implement.

The design and construction of composite CSOC circuits are of practical benefit in that they rapidly determine convolutional codes with widely varying efficiencies, such as $qm/q(m+1)+1$, $(qm-1)/q(m+1)$ and $(qm-1)/q(m+1)+1$. In the preceding expressions, q and m are positive integers.

These composite CSOCs are not optimized, but all enable coders and decoders to be implemented simply and quickly. These coders and decoders can operate at very high bit rates because of their simplicity. Although it is theoretically possible to construct optimal convolutional codes with the same efficiency, designing and building larger convolutional codes would require enormous computing power, making this task too difficult. Moreover, these large convolutional codes would not be so easy to decode as those proposed by the invention.

The present invention therefore consists in an error correcting coding method in which streams of bits to be coded are coded using a convolutional self-orthogonal coding circuit, characterized in that the method includes:

converting bits of said streams of bits to be coded into sub-blocks, parallel orthogonal convolutional coding of the bits of the sub-blocks to produce sub-symbols in parallel, the convolutional self-orthogonal codes having an efficiency of $m/(m+1)$ where m represents the number of bits in a sub-block, and concatenating the sub-symbols.

The concatenation can be simple juxtaposition of the coded sub-symbols in time and/or in space. The concatenated sub-symbols are then transmitted as required. They are correspondingly decoded at the is receiving end. The coding is effected in stages.

The invention also consists in coding apparatus in which streams of bits to be coded are coded using a convolutional self-orthogonal coding circuit, characterized in that the apparatus includes:

a multiplexer for converting the streams of bits to be coded into sub-blocks of bits, convolutional self-orthogonal coding circuits in parallel for coding bits of said sub-blocks and producing sub-symbols in parallel, convolutional self-orthogonal coding circuits having an efficiency of $m/(m+1)$ where m represents the number of bits of a sub-block of bits, and a concatenation circuit for concatenating the sub-symbols.

The coding circuit is normally connected to a circuit for transmitting blocks of sub-symbols. At the receiving end, a decoding circuit performs the converse transformation.

BRIEF DESCRIPTION OF THE DRAWINGS

The invention will be better understood after reading the following description and examining the accompanying drawings. The drawings are given by way of non-limiting example of the invention. In the figures.

DETAILED DESCRIPTION OF THE INVENTION

Figure 1:
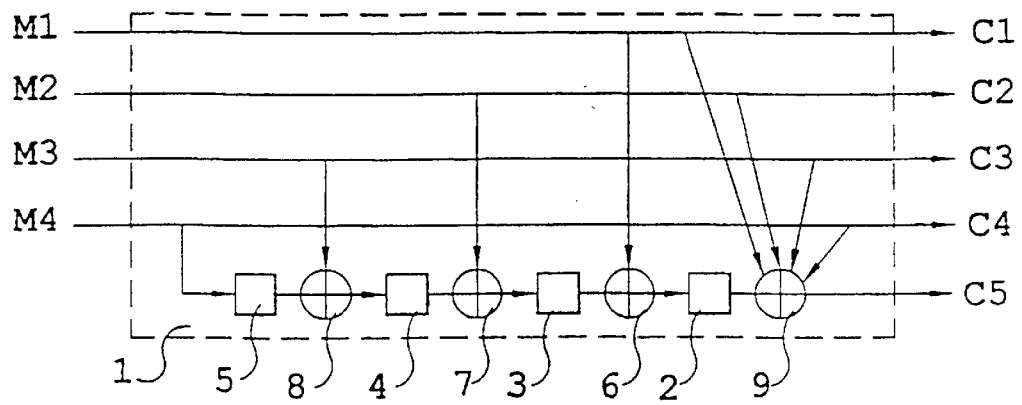
FIG. 1 shows an orthogonal convolutional coding circuit used in the invention with an efficiency of $m/(m+1)$.

FIG. 1 shows an example of an orthogonal convolutional coding circuit 1 used in the invention with an efficiency of $m/(m+1)$. When circuits in accordance with the invention are described, they are preferably hardwired circuits, because this technology is more suitable for implementation in the form of integrated circuits and meeting the expected processing speed imperatives. It would nevertheless be equally feasible to implement the functions of these circuits using very fast microprocessors, additionally conferring some decree of programmability. In the example shown, the circuit 1 therefore has four inputs for receiving binary signals M1 to M4. The circuit 1 produces five output signals C1 to C5. In practice, the number of input signals can be higher. Signals C1 to C4 are identical to input signals M1 to M4. However, signal C5 is produced by combining signals M1 to M4 and signals delivered by time-delay circuits 2, 3, 4 and 5 receiving the respective signals M1 to M4. These time-delays are applied by adders 6 to a to signals M1 to M4, respectively, in common with a signal from a preceding time-delay circuit 3, 4 and 5, respectively. Signal C5 is obtained by adding the signal produced by the time-delay circuit 2 and each of signals M1 to M4 in a last adder 9. The circuit shown in FIG. 1 is purely binary and signals M1 to M4 and C1 to C5 are binary signals, i.e. coded on one bit.

The circuit shown in FIG. 1 uses convolutional coding because in producing the signal C5 it uses the four signals M1 to M4 which are present and the signal M1 from the preceding block of bits, the signal M2 from the still earlier block of bits, and likewise for signals M3 and M4. The coding circuit 1 has an efficiency R of 4/5, a number J of sets of orthogonal verifications equal to 2 and a constraint length Na equal to 25. In these expressions, the role of J is to provide a measure of the minimum distance. The greater the value of J, the better can the code correct errors in the bits transmitted. In practice, the number of transmitted bits corrected is equal to half the value of J. There are two constraint lengths. The constraint length Na is defined as the total number of bits involved in the coding operation. In practice, the number Ma is equivalent to the number of logic gates that the circuit must include. The effective constraint length Ne is the number of different error bits that appear in J orthogonal equations. A CSOC becomes increasingly powerful as the value of Ne is reduced for a fixed value of J. The value of Na does not have any direct and explicit impact on the capacity of a CSOC. Here the description refers to the circuit 1 shown in FIG. 1 in which (R, J, Na) are equivalent to (4/5, 2, 25). In practice, a (8/9, 7, 3519) or (9/10, 7, 4860) or (16/17, 6, 11594) code can be used. Other codes are discussed later.

All the orthogonal convolutional codes described have an efficiency of m /(m+1). The efficiency of these codes is high. A good CSOC must have a high value of J and a small value of Ne.

Figure 2:
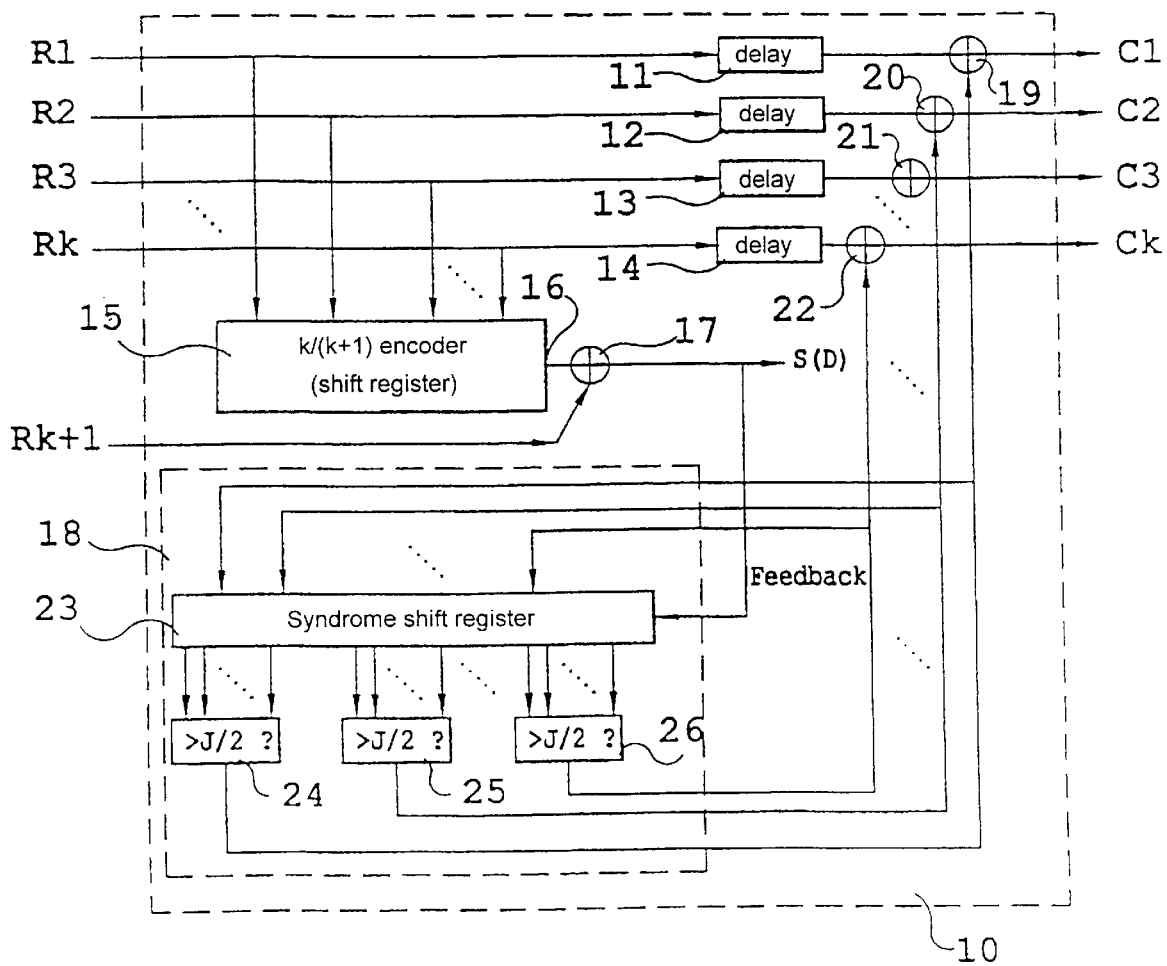
FIG. 2 shows a decoding circuit associated with the coding circuit shown in FIG. 1, to show its simplicity, and preferably including a feedback improvement.

FIG. 2 shows a CSOC decoding circuit 10. This decoding circuit can be associated with the coding circuit shown in FIG. 1 for k=4. The decoding circuit 10 receives k+1 symbols R1 to Rk+1 and produces k wanted signals M1 to Mk. The decoder 10 also includes time-delay circuits 11 to 14 in each transmission channel for signals R1 to Rk. The time-delays are identical in order to produce a block of corresponding signals M1 to Mk for a block of received signals R1 to Rk+1. The time-delays have a duration of k times the bit time of the received signals Ri (or transmitted signals Mi). An encoder 15 processes signals R1 to Rk in a similar manner to that in which the coder 1 shown in FIG. 1 processes signals M1 to Mk (M4, with k=4 on generalizing the coder shown in FIG. 1). The encoder 15 produces a convoluted symbol at its output 16. The convoluted symbol from the output 16 is added modulo 2 in a one-bit adder 17 to the received symbol Rk+1 (from the functional point of view, the EXCLUSIVE-OR operator is applied to the convoluted symbol from the output 16 and to the symbol Rk+1).

With this structure, the signal available at the output of the encoder 15 is equal to the signal Ck+1 (C5) produced by the adder 9, if transmission is not degraded. In this case, the output of the adder 17 is equal to zero. On the other hand, if any of the received signals R1 to Rk+1 is not identical to the corresponding transmitted signal C1 to Ck+1, the signal produced at the output of the adder 17 is an error indicator signal with the value 1. The signal at the output of the adder 17 is referred to as a syndrome signal S(D). In practice, the signal S(D) is fed into an error correcting circuit 18. The circuit 13 has one input, at which it receives the syndrome signal S(D) from the adder 17, and k outputs. The k outputs are connected to one-bit adders 19 to 22 to correct the received signals R1 to Rk by addition, as a function of the value of the syndrome signal, to produce the corresponding true signals M1 to Mk.

For simplicity, if there is no error, the value of the syndrome signal is 0 and the k outputs of the circuit 18 produce 0 signals which do not modify the signals R1 to Rk delivered in the adders 19 and 22. On the other hand, if an error has occurred, the syndrome signal S(D) causes a corresponding correction signal to be generated. In practice, the circuit 18 includes a set of time-delay circuits in the form of a shift register 23 clocked at the bit block frequency. The cells of the syndrome shift register receive the syndrome signal in cascade. The register 23 forms J signals for k threshold comparators 24 to 26. The k comparators 24 to 26 compare the sum of the J signals to J/2. If this threshold is exceeded, there is an error and a corresponding signal input to the corresponding adder 19 to 21 corrects the error.

The signals at the output of the circuit 18 are fed back and injected into the cascade of cells of the shift register. The benefit of feedback is to cancel out propagation of errors. Each time that an error is detected and corrected, it is reintroduced by the feedback into the corresponding syndrome signals. This means that the influence of this error on subsequent signals can be eliminated, to the extent that propagation of errors is reduced or even eliminated. The principle of this kind of threshold decoding is well-known in the art.

Figure 3:
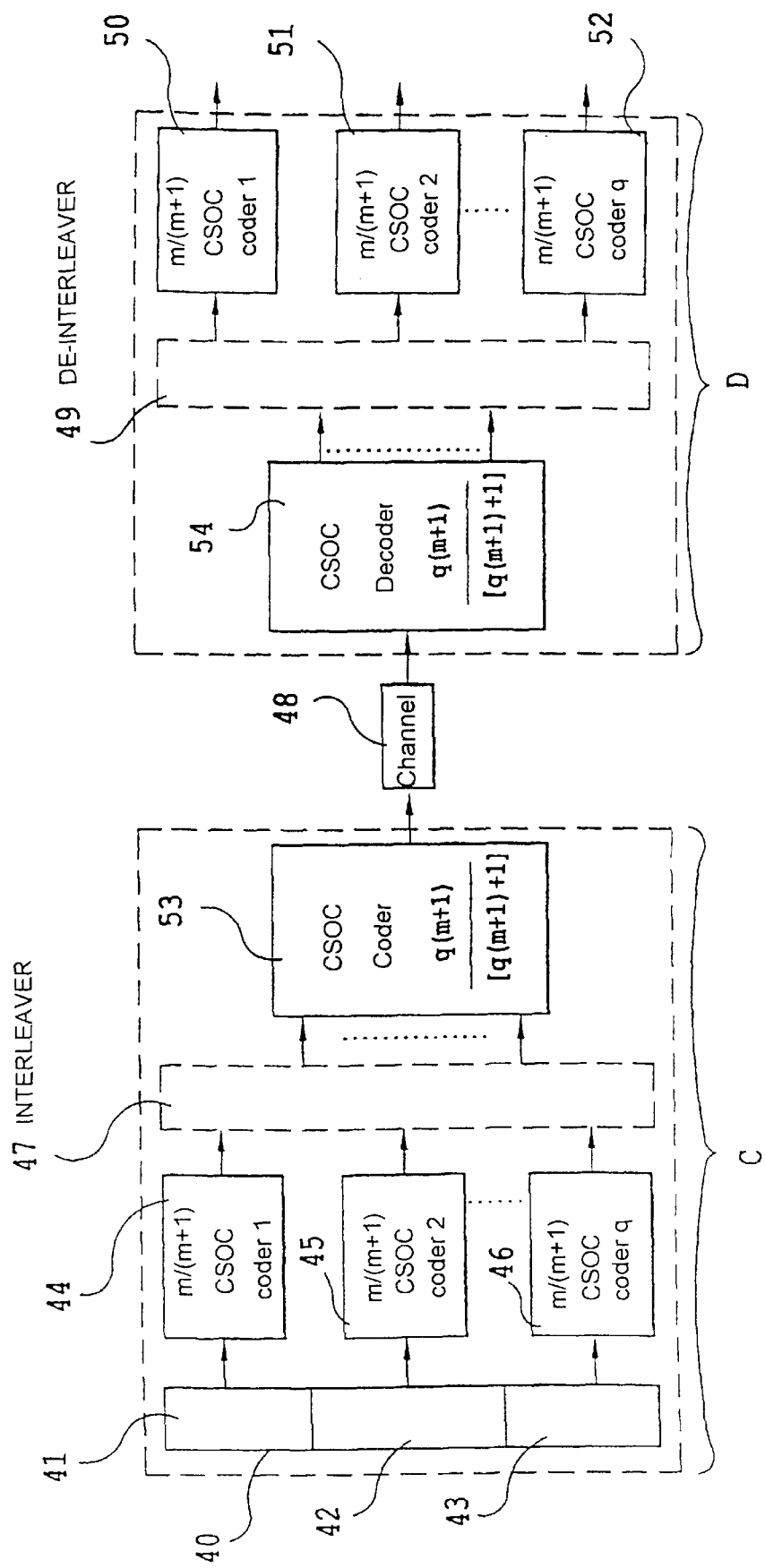
FIGS. 3 to 5 show embodiments of coding and decoding circuits in accordance with the invention.

FIG. 3 shows one example of a coding circuit C and a decoding circuit D in accordance with the invention. The coding circuit C converts streams of bits to be transmitted into sub-blocks in parallel. Thus a stream of qm bits to be transmitted is divided into q sub-blocks each of m bits by mux/demux unit 40 operating so as to create the sub-blocks. Any type of unit 40 can be used to form the blocks or sub-blocks. All that is required is for the unit to be able to operate and a high bit rate. Such circuits are readily available and their function is simple. Sub-blocks of bits 41 to 43 are then fed into respective convolutional self-orthogonal coding circuits 44 to 46. The circuits 44 to 46 are therefore composite circuits in accordance with the invention in parallel. The circuits 44 to 46 are of the type shown in FIG. 1. In the preferred example, they are coders with an efficiency of m/(m+1). They process m bits and produce m+1 symbols. All the symbols produced by the coders 44 to 46 are demultiplexed in mux/demux unit 47 referred to hereafter simply as "demultiplexer" 47, before they are transmitted on the channel 48, i.e. on the optical fiber in this example. The coders 44 to 46 are preferably identical. The demultiplexer 47 plays at least the role of a concatenation circuit to provide an interface with the channel 48.

At the receiving end, a multiplexer 49 receives the symbols transmitted and supplies them to q decoders 50 to 52 respectively corresponding to the a coders 44 to 46 and conforming to the decoding circuit shown in FIG. 2. Given the greater number of bits processed in parallel in the sub-blocks, the circuits 44 to 46 are slightly more complex than that shown in FIG. 1. They are still very simple, however.

In particular, the adders and the time-delay is circuits of all the circuits can be implemented in the form of shift circuits. This enables use of the bit rates of 10 Gbits per second previously referred to. Electronic gates are currently available which are capable of operating at these speeds.

The demultiplexer 47 can be an interleaver whose outputs are connected to another CSOC coder 53. Receiving q times m+1 sub-symbols, the coder 53, which is of the same type as the decoders 44 to 46, produces q(m+1)+1 symbols. In practice, the overall circuit C comprising the q coders 44 to 46, the interleaver 47 and the coder 53 applies coding with an efficiency qm/(q(m+1)+1). At the receiving end, a decoder 54 of the same type as the decoder shown in FIG. 2, but corresponding to the coder 53, supplies q(m+1) sub-symbols for q(m+1)+1 received symbols. The q(m+1) sub-symbols are injected into the multiplexer 49 which then preferably serves as a de-interleaver.

Figure 4:
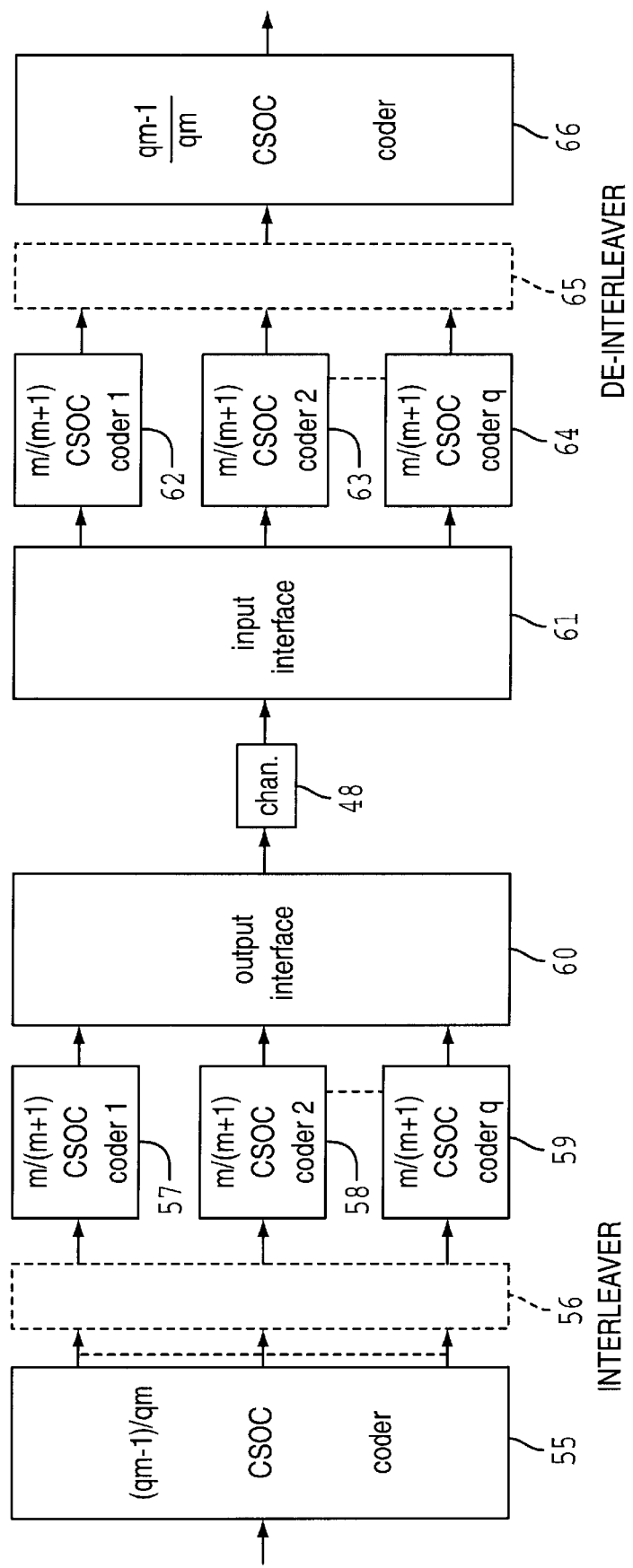

FIG. 3 shows an arrangement of q coders 44 to 46 in parallel followed by a CSOC coder 53. FIG. 4 shows a different arrangement in which a CSOC coder 55 receives streams of qm−1 bits which it converts after processing into blocks of qm bits. The qm bits are fed into a multiplexer interleaver 56. The interleaver 56 serves both as an interleaver to interleave the qm bits produced by the coder 55 and the role of a multiplexer, like the multiplexer 40, for feeding the composite CSOC coders. The interleaver 56 is therefore associated with CSOC coders 57 to 59 with an efficiency of m/m+1. The q coders 57 to 59 therefore receive q blocks each of m bits (forming qm bits) which they convert into q(m+1) symbols. The q(m+1) symbols are injected into a transmission channel 48 via an output interface 60. At the receiving end, an input interface 61 serves as a multiplexer and feeds q CSOC decoders 62 to 64 which are of the converse type to the coders 57 to 59. Outputs of the decoders 62 to 64 are fed into a multiplexer 65 preferably serving as is a de-interleaver if the multiplexer 56 served as an interleaver. The multiplexer 65 then feeds a CSOC decoder 66 which is the reciprocal of the coder 55. The decoder 66 then produces the streams of qm−1 bits sent and received. In this case, the coder 55 and the decoder 66 serve as exterior coding circuits. The circuits 55 and 66 can be replaced by Reed-Solomon circuits.

Figure 5:
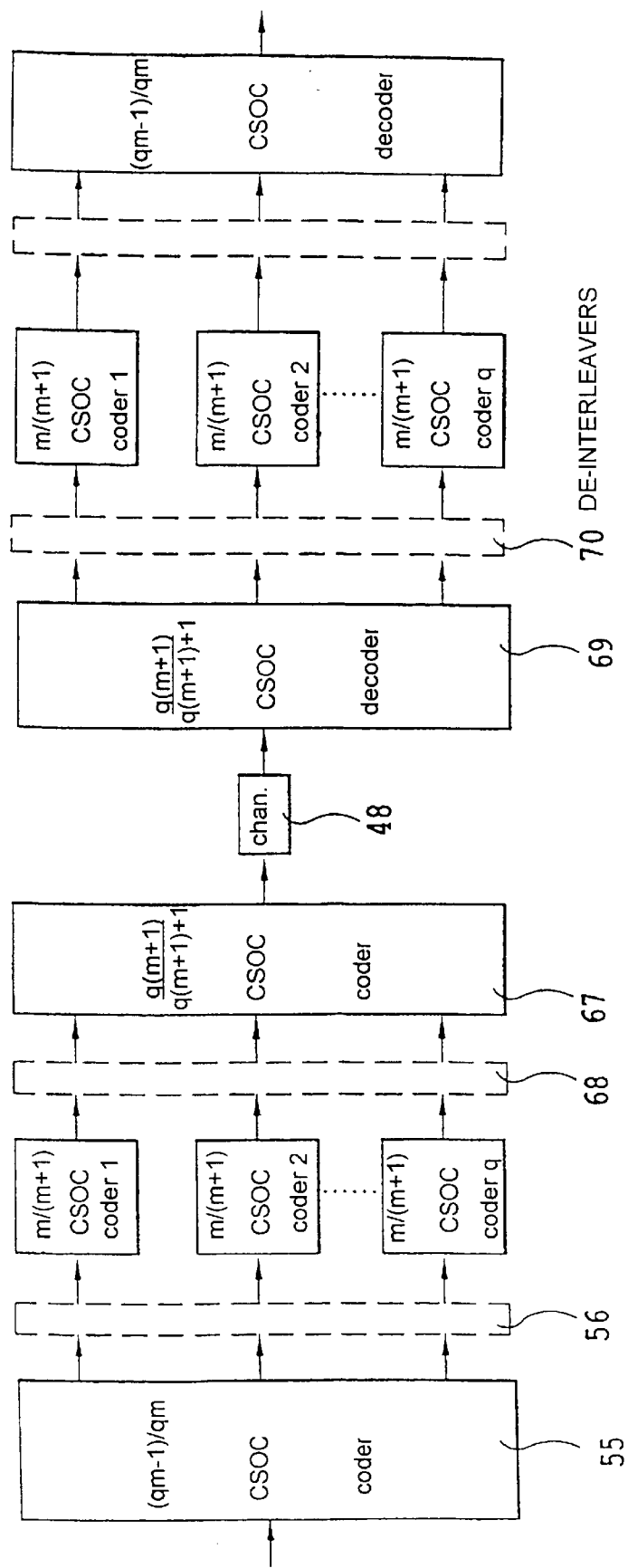

FIG. 5 shows an even more complex organization in which the parallel assembly of the CSOC circuits is between a CSOC coder 55 identical to that shown in FIG. 4 and a CSOC coder 67 with an efficiency of q(m+1)/(q(m+1)+1). In this case, a second interleaver 68 is placed between the parallel group of coders 57 to 59 and the coder 65. At the receiving end, a CSOC type decoder 69 corresponds to the coder 67 and a de-interleaver 70 corresponds to the interleaver 68. The rest of the circuit is identical to that shown in FIG. 4.

It can be seen that in all cases the CSOC coders have an efficiency of m/(m+1), i.e. a high efficiency. These coders are of very simply design: see FIG. 1. On the other hand, combining them in parallel provides highly varied overall efficiencies. Also, given the frequency occupancy of a signal spectrum to be transmitted, the efficiency can be adjusted as finely as may be required to occupy the available band optimally. It can be seen that the complexity of the circuits involved is very low and therefore supports very high bit rates. It is possible to effect as many series-parallel-series or parallel-series-parallel arrangements as may be necessary to adapt the efficiency to what is required.

The arrangements shown in FIGS. 3 to 5 provide performance different to that of the component codes used in their construction. This is because the composite CSOC of the present invention are more complex but have the advantage of being able to be decoded step by step by majority logic decoders, preferably with feedback, of low complexity. Although the composite CSOC are no longer forcibly CSOC, they can be decoded by feedback threshold decoders which are simple and therefore fast. It can be shown that composite CSOC constructed by the methods of the invention are systematic convolutional codes. This is illustrated by the following mathematical treatment.

The following expansions are valid for any two cascaded CSOC type circuits $C_1$ and $C_2$ :

$G_1$ (D) denotes the generator matrix of the coding of circuit $C_1$ , in the systematic form $$G_1(D)=[I_m|q],$$

where $I_m$ is the unit matrix of rank m,
and where $q=[g_1(D), g_2(D), \ldots, g_m(D)]$.
Similarly, for the coding of circuit $C_2$ , $$G_2(D)=[I_{m+1}|q],$$

where $I_{m+1}$ is the unit matrix of rank m+1,
and where $q=[q_1(D), q_2(D), \ldots, q_{m+1}(D)]$.
These two codings in cascade are equivalent to a single coding of efficiency m/m+2, whose generator matrix is given by the equation $$G(D)=G_1(D)*G_2(D)=[G_1|G_1*q]=[I_m|q|r],$$

where $$r=[q_1(D)+g_1(D)*q_{m-1}(D), q_2(D)+g_2(D)*q_{m-1}(D), \ldots, q_m(D)+g_m(D)*q_{m+1}(D)]$$

Although the composite coding is arguably still CSOC coding, the code produced by this composite coding can be decoded by two majority logic CSOC decoders with feedback in cascade. The two decoders are of the (m+2)/(m+1) and (m+1)/m type, respectively. Interleaving may optionally be provided between the two decoders. This type of decoding is more advantageous than a single (m+2)/m decoder, which exists in theory but is very complex to design and make. Note, however, that a cascade requires the sub-symbols delivered by a circuit to be the bits of the next circuit.

With reference to the CSOC circuits $C_1$ and $C_2$ in parallel, the following expansions apply:

$G_1(D)$ denotes the generator matrix of the coding of the circuit $C_1$, in the systematic form $$G_1(D)=[I_m|q],$$

where $I_m$ is the unit matrix of rank m,
and where $q=[g_1(D), g_2(D), \ldots, g_m(D)]$.
Similarly, for the coding of circuit $C_2$, $$G_2(D)=[I_n|q],$$

where $I_n$ is the unit matrix of rank n,
and where $q=[q_1(D), q_2(D), \ldots, q_n(D)]$.

These two codes in cascade are then equivalent to a single code C of efficiency (m+n)/(m+n+2), with its generator matrix given by the equation $$G(D) = \left[ I_{m+n} \left| \begin{array}{c|c} g & 0 \\ \hline 0 & q \end{array} \right. \right]$$

This code is also decoded by two majority logic decoders with feedback in parallel. However, in this case, the presence of m and n mean that the efficiency can be modified on demand, either by distinguishing between m and n and/or by using more or fewer CSOC circuits in parallel.

In circuit C (FIG. 3), the CSOC circuits 44 to 46 can therefore have the same or different efficiencies. If they are different, the scheme of the composite code offers the capacity of Unequal Error Protection (UEP), a property which is required in many multimedia transmission and storage applications.

In fiber optic transmission systems, the electrical signals are processed largely in parallel to match the high speed in the optical fiber. In implementing composite CSOC circuits, the invention proposes coders/decoders in parallel with a single clock. If all the inputs and outputs are in parallel, the maximum speed is achieved with a single clock. In this embodiment, with one clock pulse, the coder outputs all the coded binary symbols in parallel. Consequently, the decoder outputs all the decoded bits in parallel. Because of this, the composite CSOC coding circuits and the composite CSOC decoding circuits can be implemented in a systolic type architecture, which is particularly beneficial in high bit rate transmission applications. The coders and decoders are in parallel and use a single clock in all the structures mentioned hereinabove.

Multiplexing and demultiplexing can be used in applications where one of the composite CSOC schemes is employed, not only to obtain a coding gain but also to adjust the various bit rates present at the interfaces. In these cases the clock timing must be changed. This option provides the flexibility needed to insert a composite CSOC coder and decoder (codec) into a terminal equipment of a fiber optic transmission system.

The composite CSOC can be used either as interior codes of concatenated coding systems or as the only code in transmission and storage systems which require a low complexity but a high bit rate.

The CSOC decoders are of the majority logic type with feedback. Because of the feedback, they do not produce error packets at the output. However, uncorrected errors reach the output untouched. For these errors to be processed by subsequent decoders, interleavers are proposed as an option in FIGS. 3 to 5.

The CSOC can equally be decoded using soft decisions by symbol by symbol algorithms, for example the A Posteriori Probability (APP) algorithm and simplified versions of it, as described for example in the article "New convolutional codes—Part III", IEEE Transaction on Communications, Vol. COM-23, No. 9, Jan. 76. The article indicates that coding by composite CSOC circuits in cascade is decoded by this type of algorithm, which is applied to each component code.

Although the structures obtained by combining component CSOC apply to other component codes, for example binary or non-binary block codes, CSOC are preferred because they have a particular property. Majority logic CSOC decoders with feedback do not produce error packets at the output of the decoders if errors are present at their input which do not exceed their correction capacity. This property guarantees that errors are not propagated from one stage to another in a majority logic composite CSOC decoder with feedback. The number of errors is always decreased across a majority logic decoder with feedback.

FIGS. 2–5 show a few examples of composite CSOC. Many others are possible. The interleaving within the dashed line box is optional in all these schemes.

FIG. 3 shows an example of construction from q identical m/(m+1) CSOC circuits in parallel. A single qm/(q(m+1)+1) CSOC circuit concatenates the sub-symbols produced. For example, if m=8 and q=3, the global code is a 24/28=6/7 code and therefore a new code. The composite code nevertheless performs better than all its component codes.

FIG. 4 shows another construction using a first composite (qm−1)/qm CSOC circuit in cascade with q identical CSOC m/m+1 coding circuits in parallel. The global code is a (qm−1)/q(m+1) code. For example, if m=8 and q=4, the code is a new code with an efficiency of 28/36=7/9. The composite code performs better than all its component codes.

FIG. 5 shows a further series-parallel-series construction using a (qm−1)/qm composite CSOC circuit in cascade with a identical m/(m+1) CSOC circuits in parallel, the sub-symbols produced by which are then concatenated in a q(m+1)/(q(m+1)+1) CSOC circuit. The global code is of the (qm−1)/(q(m+1)+1) type. For example, if m=6 and q=4, a new 23/29 code is created. The composite code performs better than all its component codes.

The advantages of the solution in accordance with the invention are as follows: low complexity, variable efficiency, good performance, unequaled error protection and use at high bit rates with a single clock, of the systolic type.

Also, parallelism has certain advantages over concatenation in cascade in the construction of the composite CSOC. Parallelism enables construction of a composite CSOC without excessively increasing the global constraint length, by avoiding placing too many CSOC in cascade.

The CSOC are decodable by the APP family of algorithms using soft decisions.

The APP algorithm can be applied even with firm decisions with feedback, and better performance is obtained. As the invention uses a decoder composed of a plurality of simple decoders in parallel and in series, it is possible to decode the component codes using the soft decision APP algorithm as early as the second level. By applying an APP algorithm, with or without feedback, each decoder becomes a Soft-input-Soft-Output (SISO) decoder, enabling a form of iterative decoding referred to as Turbo decoding, greatly enhancing the performance of the composite CSOC scheme.

What is claimed is:

1. An error correcting coding method, comprising:
   coding streams of bits using a convolutional self-orthogonal coding circuit,
   converting the bits of said streams into sub-blocks,
   performing parallel orthogonal convolutional coding of the bits of the sub-blocks to produce sub-symbols in parallel, wherein the convolutional self-orthogonal codes have an efficiency of m/(m+1), where m represents the number of bits in a sub-block, and
   concatenating the sub-symbols,
   wherein the concatenating of the sub-symbols is followed by a step of orthogonal convolutional coding of the concatenated sub-symbols.

2. A method according to claim 1, wherein the concatenating of the sub-symbols is performed by transforming the sub-symbols in parallel into a concatenated coded form.

3. A method according to claim 1, wherein the concatenating of the sub-symbols is performed by interleaving the sub-symbols in parallel.

4. A method according to claim 1, wherein the step of converting the bits of the streams into sub-blocks is followed by a step of coding each of the sub-blocks using a Reed-Solomon exterior code.

5. A method according to claim 1, characterized in that the sub-blocks are of identical size.

6. A method according to claim 1, characterized in that the convolutional self-orthogonal codes are decoded by Turbo iterative APP decoders.

7. An error correcting coding method, comprising:
coding streams of bits using a convolutional self-orthogonal coding circuit,
converting the bits of said streams into sub-blocks,
performing parallel orthogonal convolutional coding of the bits of the sub-blocks to produce sub-symbols in parallel, wherein the convolutional self-orthogonal codes have an efficiency of m/(m+1), where m represents the number of bits in a sub-block, and
concatenating the sub-symbols,
wherein the convolutional self-orthogonal codes are one or more of:
the 8/9, 7, 3519 (R, J, NA) type,
the 9/10, 7, 4860 (R, J, NA) type, and
the 16/17, 6, 11594 (R, J, NA) type.

8. An error correcting coding method, comprising:
coding streams of bits using a convolutional self-orthogonal coding circuit,
converting the bits of said streams into sub-blocks,
performing parallel orthogonal convolutional coding of the bits of the sub-blocks to produce sub-symbols in parallel, wherein the convolutional self-orthogonal codes have an efficiency of m/(m+1), where m represents the number of bits in a sub-block, and
concatenating the sub-symbols,
wherein the converting of the bits of the streams into sub-blocks is performed by a cascaded succession of CSOC coding and multiplexing interleaving.

9. A method according to claim 8, characterized in that:
the blocks of sub-symbols produced by composite CSOC coding are interleaved, and
the interleaved sub-symbols are coded by CSOC coding.

10. An error correcting coding and decoding method, comprising:
coding streams of bits using a convolutional self-orthogonal coding circuit,
converting the bits of said streams into sub-blocks,
performing parallel orthogonal convolutional coding of the bits of the sub-blocks to produce sub-symbols in parallel, wherein the convolutional self-orthogonal codes have an efficiency of m/(m+1), where m represents the number of bits in a sub-block, and
concatenating the sub-symbols,
decoding the convolutional self-orthogonal codes using majority logic decoders.

11. A method according to claim 10, characterized in that the majority logic decoders are of the feedback type.

12. A method according to claim 10, characterized in that the orthogonal convolutional codes are decoded in steps.

13. A decoding apparatus for implementing the method according to claim 10, characterized in that it includes decoders of the Turbo iterative APP type.

14. A decoding apparatus for implementing the method according to claim 10, characterized in that it includes majority logic decoders for decoding the convolutional self-orthogonal codes.

15. Apparatus according to claim 14, characterized in that said majority logic decoders are of the feedback type.

16. Apparatus according to claim 14, characterized in that it includes a plurality of convolutional self-orthogonal code decoder stages.

17. A coding apparatus, comprising:
a mux/demux unit converting streams of bits, to be coded, into sub-blocks of bits,
convolutional self-orthogonal coding (CSOC) circuits, in parallel, coding the bits of said sub-blocks and producing corresponding sub-symbols in parallel, and each having an efficiency of m/(m+1) where m represents the number of bits of a sub-block of bits, and
a concatenation circuit for concatenating the sub-symbols, wherein:
the mux/demux unit includes another CSOC coding circuit and an interleaver,
the CSOC coding circuit of the mux/demux unit receives the streams of bits, and outputs coded streams of bits, and
the interleaver provides the sub-blocks of bits from the coded streams of bits.

18. A coding apparatus, comprising:
a mux/demux unit converting streams of bits, to be coded, into sub-blocks of bits (41–43),
convolutional self-orthogonal coding (CSOC) circuits, in parallel, coding the bits of said sub-blocks and producing corresponding sub-symbols in parallel, and each having an efficiency of m/(m+1) where m represents the number of bits of a sub-block of bits,
a concatenation circuit for concatenating the sub-symbols, and
another CSOC circuit for coding the sub-symbols.

19. Apparatus according to claim 18, characterized in that it includes an interleaver for blocks of sub-symbols produced by composite CSOC coding.

* * * * *